(12) United States Patent
Koyama et al.

(10) Patent No.: US 8,547,179 B2
(45) Date of Patent: Oct. 1, 2013

(54) PLL CIRCUIT AND SEMICONDUCTOR DEVICE HAVING THE SAME

(75) Inventors: Jun Koyama, Sagamihara (JP); Takeshi Osada, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 18 days.

(21) Appl. No.: 13/301,070

(22) Filed: Nov. 21, 2011

(65) Prior Publication Data

US 2012/0062315 A1    Mar. 15, 2012

Related U.S. Application Data

(60) Continuation of application No. 12/885,819, filed on Sep. 20, 2010, now Pat. No. 8,120,435, which is a division of application No. 11/918,341, filed as application No. PCT/JP2006/309062 on Apr. 24, 2006, now Pat. No. 7,800,455.

(30) Foreign Application Priority Data

Apr. 27, 2005   (JP) ................................. 2005-130491

(51) Int. Cl.
*H03K 3/03*    (2006.01)
(52) U.S. Cl.
USPC ........................................... 331/57; 327/395
(58) Field of Classification Search
USPC .......................................... 331/57; 327/395
See application file for complete search history.

(56) References Cited

U.S. PATENT DOCUMENTS

| 5,416,446 | A | 5/1995 | Holler, Jr. et al. |
| 5,594,391 | A | 1/1997 | Yoshizawa |
| 5,686,714 | A | 11/1997 | Abe et al. |
| 5,862,174 | A | 1/1999 | Yokota et al. |
| 5,949,047 | A | 9/1999 | Abe et al. |
| 6,072,372 | A | 6/2000 | Yokoyama |

(Continued)

FOREIGN PATENT DOCUMENTS

| EP | 0 601 780 | 6/1994 |
| EP | 0 621 689 | 10/1994 |

(Continued)

OTHER PUBLICATIONS

European Search Report (Application No. 06732476.4) Dated Dec. 14, 2011.

(Continued)

*Primary Examiner* — Joseph Chang
(74) *Attorney, Agent, or Firm* — Eric J. Robinson; Robinson Intellectual Property Law Office, P.C.

(57) ABSTRACT

A PLL circuit includes a phase detector, a loop filter (LF), a voltage-controlled oscillator (VCO), and a frequency divider. The phase detector compares a phase of a signal Fs which is input from outside with a phase of a signal Fo/N which is input from the frequency divider. The loop filter generates a signal Vin by removing alternating current components from a signal input from the phase detector. The voltage-controlled oscillator outputs a signal Fo based on the signal Vin input from the loop filter. The frequency divider converts the signal Fo output from the voltage-controlled oscillator into Fo/N (frequency division by N), and outputs it to the phase detector.

17 Claims, 13 Drawing Sheets

(56) References Cited

U.S. PATENT DOCUMENTS

| | | |
|---|---|---|
| RE38,274 E | 10/2003 | Boudry |
| 7,472,296 B2 | 12/2008 | Kato et al. |
| 7,494,066 B2 | 2/2009 | Koyama et al. |
| 2007/0013454 A1* | 1/2007 | Ji .................................. 331/57 |

FOREIGN PATENT DOCUMENTS

| | | |
|---|---|---|
| EP | 0 702 315 A | 3/1996 |
| EP | 2001-251186 | 9/2001 |
| JP | 08-077317 A | 3/1996 |
| JP | 08-167012 A | 6/1996 |
| JP | 09-275332 | 10/1997 |
| JP | 11-330921 | 11/1999 |
| JP | 2001-211056 A | 8/2001 |

OTHER PUBLICATIONS

International Search Report (Application No. PCT/JP2006/309062) dated Aug. 1, 2006.

Written Opinion (Application No. PCT/JP2006/309062) dated Aug. 1, 2006.

\* cited by examiner

PLL CIRCUIT AND SEMICONDUCTOR DEVICE HAVING THE SAME

TECHNICAL FIELD

The present invention relates to a PLL circuit and a semiconductor device having the same.

BACKGROUND ART

Conventionally, a phase-locked loop circuit (hereinafter referred to as a PLL circuit) has been known as a circuit which generates clocks with an arbitrary synchronous frequency with input signals.

A PLL circuit is mounted with a variable frequency oscillator, and compares a phase of an input signal with that of a feedback signal output from the oscillator. The PLL circuit performs negative feedback control so that the input signal is synchronized with the feedback signal (i.e., to maintain a fixed phase relationship between the input signal and the feedback signal). This control operation is called locking (also called phase locking). In addition, the time required for such control operation is called lock time (also called phase-lock time).

Lock time is generally determined by the time constant of a loop filter in a PLL circuit. If the time constant is large (if the cutoff frequency is low), locking is performed slowly, whereas if the time constant is small (if the cutoff frequency is high), locking is performed quickly. If the lock time is short, the control operation can be performed in a short time after a signal input; however, since the operation is adversely affected in the case where the input signal has noise, it is difficult to maintain stable control operation. Notwithstanding the aforementioned circumstance, a PLL circuit which can reduce the lock time independently of the operating conditions of a circuit and the manufacturing conditions is known (see Patent Document 1, for example).

[Patent Document 1] Japanese Patent Laid-Open No. 2001-251186 (page 5, FIG. 1)

However, in order to reduce the lock time, a voltage-controlled oscillator (hereinafter also referred to as a VCO) is required to operate with a stable oscillation frequency even when there is no signal input (hereinafter, this operation is referred to as a free-running oscillation) at the time when the PLL circuit starts its operation. In order to create desirable conditions for a stable free-running oscillation, a switch circuit has to be provided between an output of a loop filter (hereinafter also referred to as an LF) and an input of the VOC. A signal output from the LF corresponds to a signal obtained by removing unnecessary high frequency components from an output signal of the phase detector (a signal which represents the difference in phase between two signal inputs). The analog voltage value of this signal controls the frequency of a signal output to the VCO. Therefore, when a switch circuit is provided, an input signal of the VCO becomes unstable when it is mixed with noise or the like, and this will be a factor which makes the operation of the PLL circuit unstable. As a result, it is necessary to wait until the conditions for a stable free-running oscillation are obtained, and in such a case, it makes no sense to provide a switch circuit in order to reduce the lock time.

DISCLOSURE OF INVENTION

Thus, it is an object of the invention to reduce the interval from the time when a signal is input to a PLL circuit until it generates an arbitrary frequency. It is another object of the invention to provide a PLL circuit which can operate in a stable manner and a semiconductor device having the same.

One feature of the invention is to provide a PLL circuit which includes a voltage-controlled oscillator (VCO) including an oscillator circuit and a current source for supplying a current controlled by a voltage input to the current source (an input voltage), to the oscillator circuit through at least two of current paths.

One feature of the invention is to provide a PLL circuit which includes a voltage-controlled oscillator (VCO) including an oscillator circuit and a current source including a first current path and a second current path. The current source supplies a current to the oscillator circuit mainly through the first current path when an input voltage to the current source is high, while the current source supplies a current to the oscillator circuit mainly through the second current path when the input voltage to the current source is low.

One feature of the invention is to provide a semiconductor device which includes an antenna for wirelessly transmitting and receiving a signal. The semiconductor device further includes a rectifier circuit for generating power to drive the semiconductor device with the signal received at the antenna, a demodulation circuit for demodulating the signal received at the antenna, and a PLL circuit for generating a clock signal in synchronization with the demodulated signal. The PLL circuit includes a voltage-controlled oscillator (VCO) having an oscillator circuit and a current source for supplying a current a voltage input to the current source (an input voltage) to the oscillator circuit through at least two current paths.

One feature of the invention is to provide a semiconductor device which includes an antenna for wirelessly transmitting and receiving a signal. The semiconductor device further includes a rectifier circuit for generating power to drive the semiconductor device with the signal received at the antenna, a demodulation circuit for demodulating the signal received at the antenna, and a PLL circuit for generating a clock signal in synchronization with the demodulated signal. The PLL circuit includes a voltage-controlled oscillator (VCO) having an oscillator circuit and a current source having a first current path and a second current path. The current source supplies a current to the oscillator circuit mainly through the first current path when an input voltage to the current source is high, while the current source supplies a current to the oscillator circuit mainly through the second current path when the input voltage to the current source is low.

As a typical example of an oscillator circuit, there is a ring oscillator; however, other oscillator circuits may be employed as well, such as an LC oscillator circuit having a coil and a capacitor as its circuit elements.

With such a PLL circuit, an LF and a VCO can be directly connected to each other not by directly inputting a voltage (Vin) as a control voltage signal of the VCO, but instead by increasing an output current (Iout) of a current source circuit in the VCO (which corresponds to an output current of the current source at a certain voltage level of Vin) in order to obtain a stable free-running oscillation of the VCO.

When priority is given to the property of the LP whereby high frequency components are removed from output signals of the phase detector, the lock time becomes longer; however, when the VCO is operated stably with a free-running oscillation at a desired frequency with the use of the output current Iout of a current source, a stable PLL circuit with short lock time can be realized.

According to the invention, a PLL circuit with short lock time can be realized by using a variable frequency oscillator (VCO). Furthermore, the PLL circuit can be operated stably.

BRIEF DESCRIPTION OF DRAWINGS

In the accompanying drawings.

BEST MODE FOR CARRYING OUT THE INVENTION

Figure 1:
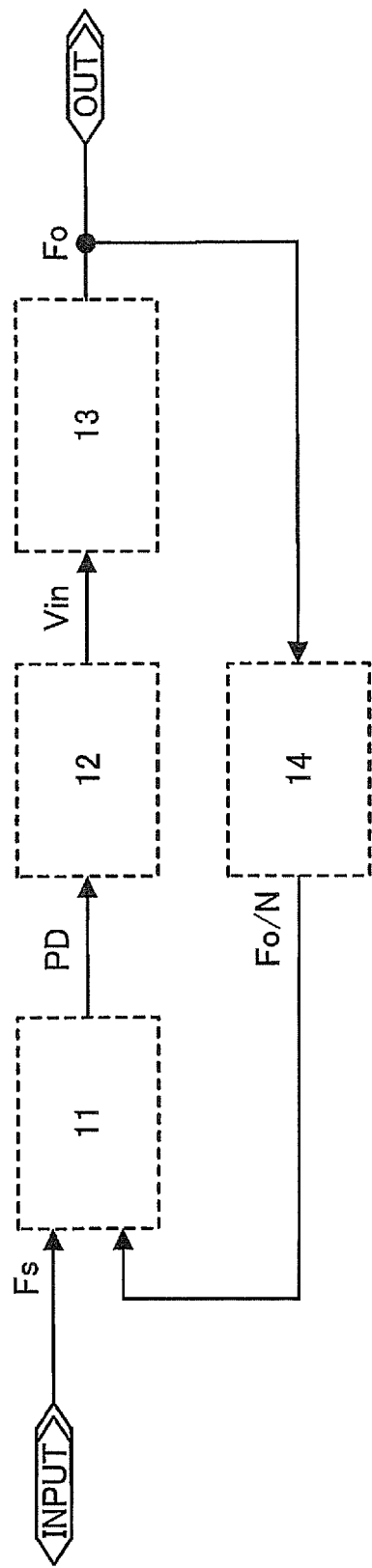
FIG. 1 shows a configuration of a PLL circuit in accordance with Embodiment Mode 1.

Although the invention will be fully described by way of embodiment modes with reference to the accompanying drawings, it is to be understood that various changes and modifications will be apparent to those skilled in the art. Therefore, unless otherwise such changes and modifications depart from the scope of the invention, they should be construed as being included therein. Note that in the constitution of the invention described hereinafter, common portions are denoted by common reference numerals in different drawings.

Embodiment Mode 1

FIG. 1 shows a block diagram of a PLL circuit in accordance with this embodiment mode. The PLL circuit includes a phase detector 11, a loop filter (LF) 12, a voltage-controlled oscillator (VCO) 13, and a frequency divider 14. The phase detector 11 compares a phase of a signal Fs which is input from outside with a phase of a signal Fo/N which is input from the frequency divider 14. The loop filter 12 generates a signal Vin by removing alternating current components from a signal input from the phase detector 11. The voltage-controlled oscillator 13 outputs a signal Fo based on the signal Vin input from the loop filter 12. The frequency divider 14 converts the signal Fo output from the voltage-controlled oscillator 13 into Fo/N (frequency division by N), and outputs it to the phase detector 11.

Note that the PLL circuit in accordance with this embodiment mode is required to have at least the voltage-controlled oscillator 13. The phase detector 11, the loop filter 12, and the frequency divider 14 are provided as appropriate when required.

Since the phase detector can be theoretically regarded as a multiplier, it can be replaced by an analog phase detector (e.g., a DBM (Double-Balanced Mixer)) or a digital phase detector (e.g., an XOR, an RD flip-flop, or a current output circuit). Similarly, since the loop filter (LP) has a function of removing high frequency components, it can be replaced by a passive loop filter (e.g., a low-pass filter or a lag-lead filter) or an active loop filter.

The frequency divider 14 divides the input frequency by N; therefore, when it is provided as a feedback circuit, a signal with a frequency N times as high as that of the input signal Fo can be obtained. The frequency divider 14 can be omitted, and in such a case, Fs=Fo is satisfied. The frequency divider 14 can be replaced by a programmable frequency divider or a swallow counter, with which Fo with an arbitrary frequency can be obtained. Alternatively, if the frequency divider 14 is replaced by a prescaler (fixed frequency divider) with a high operating frequency, Fo with a high frequency can be obtained. In order to obtain a fine waveform (output with few frequency fluctuations), it is vital that an input signal have a fine waveform; therefore, the frequency divider 14 may be replaced by a quartz-crystal oscillator as well.

Figure 2:
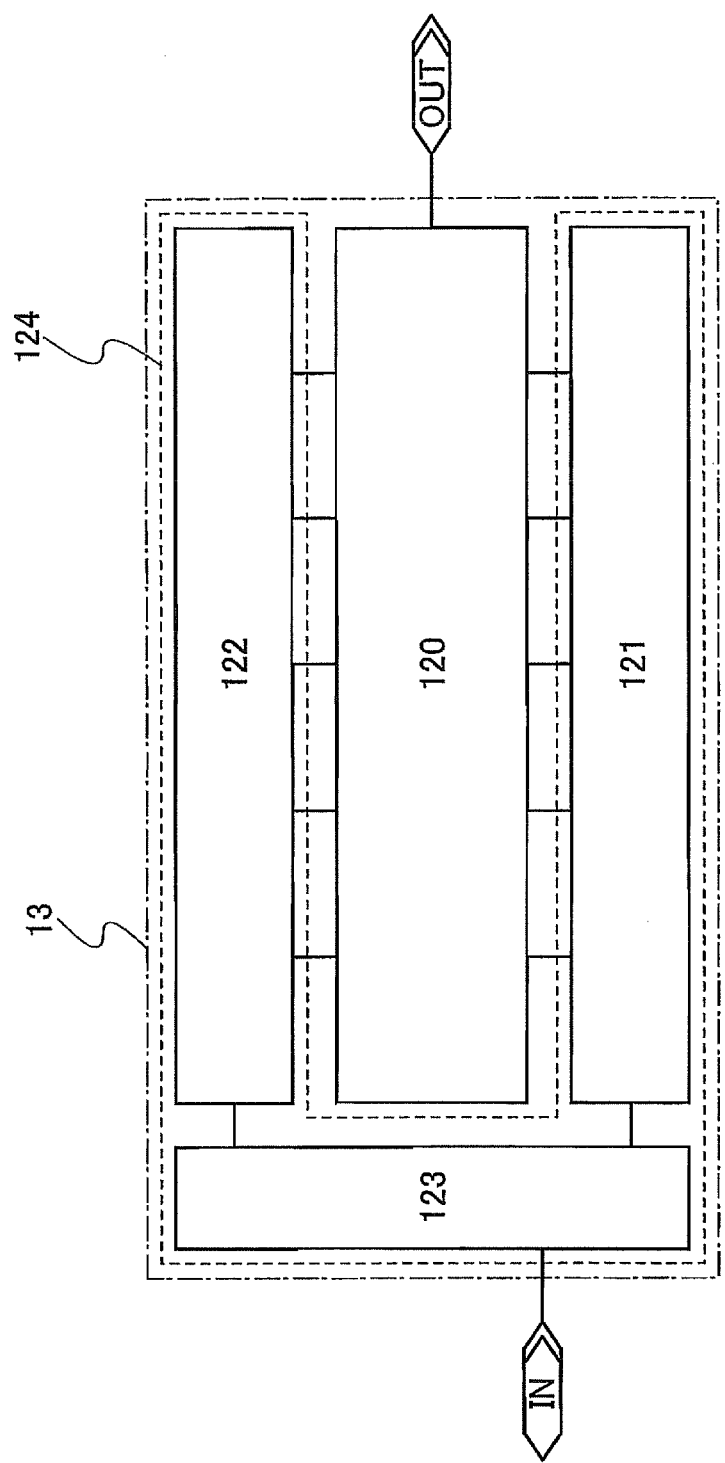
FIG. 2 is block diagram showing a configuration of a voltage controlled oscillator.

FIG. 2 is a block diagram showing a configuration of the voltage-controlled oscillator 13. The voltage-controlled oscillator 13 includes an oscillator circuit 120 and a current source 124. The current source 124 includes a control unit 123 and current source units 121 and 122. The control unit 123 controls the amount of current to be supplied to the oscillator 120 from the current source units 121 and 122 in accordance with a value of the input signal Vin of the voltage-controlled oscillator 13. The frequency of the oscillator circuit 120 changes depending on the amount of current supplied. There are a plurality of paths for currents to flow through from the current source units 121 and 122 to the oscillator circuit 120. The control unit 123 selects which of the current paths to be used for supplying a larger amount of current in accordance with the value of the input signal Vin of the voltage-controlled oscillator 13. Although a ring oscillator is typically used as the oscillator circuit 120, other oscillator circuits may be employed as well, such as an LC oscillator circuit having a coil and a capacitor as its circuit elements.

Next, a specific example of a circuit configuration of the voltage-controlled oscillator 13 is described with reference to FIG. 3. The current source unit 121 includes n-channel transistors 112 to 116, and n-channel transistors 162 to 166. The current source unit 122 includes p-channel transistors 102 to 106, and p-channel transistors 152 to 156.

The oscillator circuit 120 includes an n-channel transistor 141 and a p-channel transistor 131 which jointly constitute one inverter circuit. The inverter circuit has such a configuration that drains of the n-channel transistor 141 and the p-channel transistor 131 are connected to each other to form an output terminal, and gates of the two transistors receive a common potential. Using the aforementioned inverter circuit as a basic unit, the oscillator circuit 120 has a plurality of stages connected in series, so that an output of an inverter circuit of the present stage is connected to an input of an inverter circuit of a subsequent stage. That is, a second-stage inverter circuit is constructed of an n-channel transistor 142 and a p-channel transistor 132, a third-stage inverter circuit is constructed of an n-channel transistor 143 and a p-channel transistor 133, a fourth-stage inverter circuit is constructed of an n-channel transistor 144 and a p-channel transistor 134, and a fifth-stage inverter circuit is constructed of an n-channel transistor 145 and a p-channel transistor 135.

Figure 3:
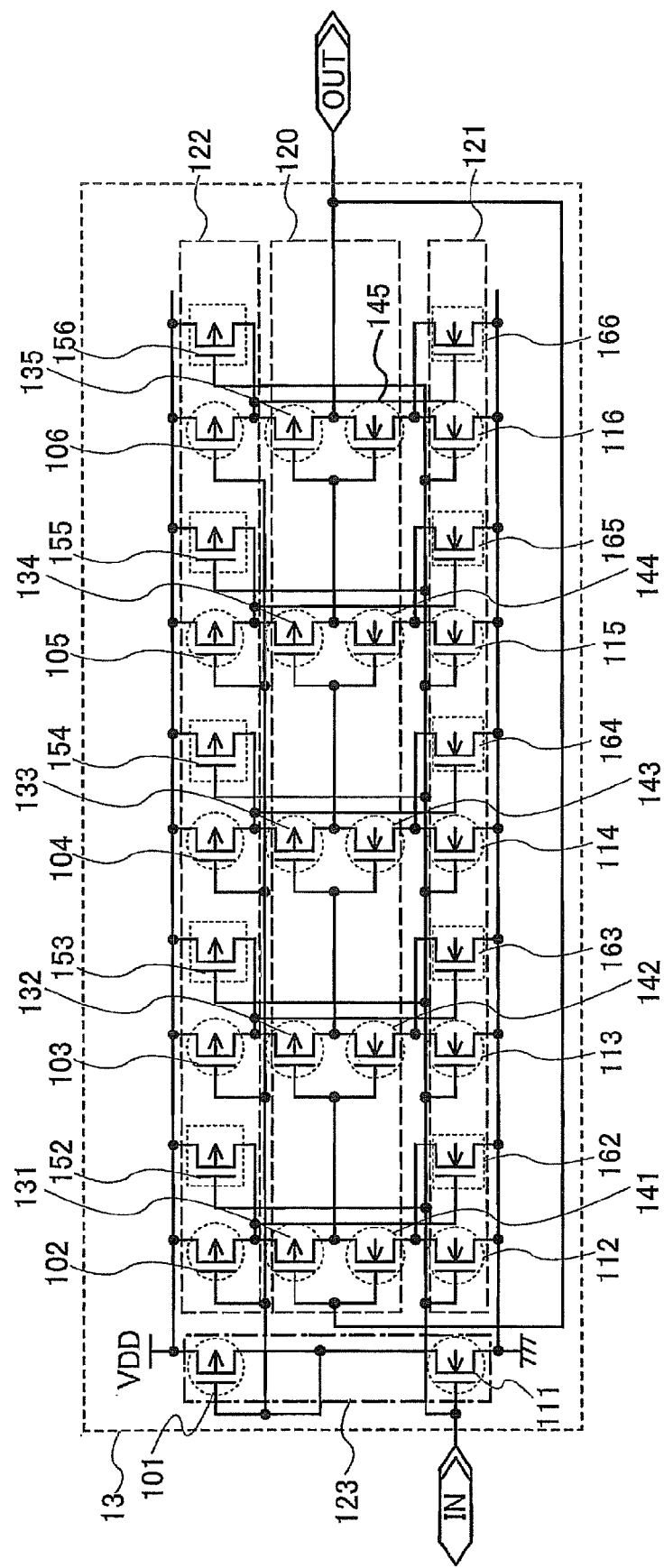
FIG. 3 shows a configuration of a voltage-controlled oscillator in accordance with Embodiment Mode 1.

Although FIG. 3 shows a configuration where five inverter circuits are connected in series to constitute the oscillator circuit 120, the number of stages to be connected in series is not limited in the invention, as long as the number of stages is an odd number. In any case, each input of an inverter circuit is connected to an output of an inverter circuit of a previous stage, and an output of the last-stage inverter circuit is connected to an input of the first-stage inverter circuit so as to form a loop configuration.

Each of the current source units 121 and 122 includes two kinds of transistors having different functions. For example, the p-channel transistor 102 in the current source unit 122 is connected to a source of the p-channel transistor 131 in the oscillator circuit 120, while the n-channel transistor 112 in the current source unit 121 is connected to a source of the n-channel transistor 141. In this configuration, the p-channel transistor 102 and the n-channel transistor 112 form a current path 1. In addition, the p-channel transistor 152 in the current source unit 122 is connected to the source of the p-channel transistor 131 in the oscillator circuit 120, while the n-channel transistor 162 in the current source unit 121 is connected to the source of the n-channel transistor 141. In this configuration, the p-channel transistor 152 and the n-channel transistor 162 form a current path 2.

Each gate of the n-channel transistors 112 to 116 on the current paths 1 is connected to the input of the voltage-controlled oscillator 13 (the output of the loop filter 12). Meanwhile, a gate of the second n-channel transistor 162 on the current path 2 is connected to a drain of the p-channel transistor 152. The n-channel transistors 163 to 166 and the p-channel transistors 153 to 156 on the current paths 2 have a similar configuration.

A drain of the p-channel transistor 102 on the current path 1 and the drain of the p-channel transistor 152 on the current path 2 are each connected to the source of the p-channel transistor 131 in the oscillator circuit 120. A gate of the p-channel transistor 102 is connected to a gate of a p-channel transistor 101 in the control unit 123, while a gate of the p-channel transistor 152 is connected to the input of the voltage-controlled oscillator 13 (the output of the loop filter 12). The gate of the n-channel transistor 112 on the current path 1 is connected to a gate of the n-channel transistor 111 in the control unit 123 of the current source 124. In addition, the gate of the p-channel transistor 152 on the current path 2 is connected to the input of the voltage-controlled oscillator 13 (the output of the loop filter 12).

The aforementioned configuration regarding the current path 1 is the same for the p-channel transistors 103 to 106, and the n-channel transistors 113 to 116. Similarly, the aforementioned configuration regarding the current path 2 is the same for the p-channel transistors 153 to 156, and the n-channel transistors 163 to 166.

In this case, more current flows in the current path 2 than in the current path 1 if the input signal Vin of the voltage-controlled oscillator 13 is small. This is in order to shorten the lock time by performing a stable free-running oscillation from the time when a signal starts to be input to the PLL circuit. When the input signal Vin of the voltage-controlled oscillator 13 is increased to a certain level, so that the PLL circuit performs phase locking to output a desired frequency, more current flows in the current path 1 than in the current path 2.

Seen as a circuit block, the voltage-controlled oscillator 13 in FIG. 3 has such a configuration that the current source unit 122, the oscillator circuit 120, and the current source unit 121 are connected in series. These elements have a plurality of stages of basic units each having a plurality of transistors as described above. Although FIG. 3 shows an example where each of the current source units 121 and 122 has five stages (five basic units), the number of stages is not limited to this.

The control unit 123 includes the p-channel transistor 101 and the n-channel transistor 111. The control unit 123 is a circuit which controls the electrical connection between the loop filter 12 and the current source units 121 and 122 in accordance with an input signal Vin of the voltage-controlled oscillator 13. A drain and the gate of the p-channel transistor 101 are each connected to a drain of the n-channel transistor 111.

In the aforementioned configuration, considering the four transistors which are connected in series (i.e., the p-channel transistor 102 in the current source unit 122, the first p-channel transistor 131 and the first n-channel transistor 141 in the oscillator circuit 120, and the n-channel transistor 112 in the current source unit 121) as one stage, FIG. 3 shows an example of providing five stages each having four transistors. Note that the invention is not limited to such a configuration although it is preferable to assume that the voltage-controlled oscillator 13 has odd-numbered stages of three or more.

One of either the source or the drain of the p-channel transistor 101 in the control unit 123 is connected to the gate thereof, while the other is connected to a high potential power supply. One of either the source or the drain of the n-channel transistor 111 in the control unit 123 is connected to a low potential power supply, while the gate of the n-channel transistor 111 is connected to the loop filter 12.

With such a configuration, the current source units 121 and 122 supply currents to the oscillator circuit 120. The oscillating frequency of the oscillator circuit 120 changes depending on the amount of current flowing therein. Each of the current source units 121 and 122 has two kinds of transistors having different functions, with which the current paths 1 and 2 are formed.

In FIG. 3, when the input signal Vin of the voltage-controlled oscillator 13 is small, more current is supplied by the p-channel transistors 152 to 156 and the n-channel transistors 162 to 166 which form the current paths 2, than the p-channel transistors 102 to 106 and the n-channel transistors 112 to 116 which form the current paths 1. This is in order to shorten the lock time by performing the operation with a stable oscillation frequency from the time when a signal starts to be input to the PLL circuit. When the input signal Vin of the voltage-controlled oscillator 13 is increased to a certain level, so that the PLL circuit performs phase locking to output a desired frequency, more current flows in the current paths 1 than in the current paths 2.

Although the input signal Vin of the voltage-controlled oscillator 13 is input to the n-channel transistor 111 in the control unit 123 of the current source 124 in FIG. 3, the invention is not limited to this configuration since the amount of current will be reversed if the input signal Vin is input to the gate of the p-channel transistor 101.

Figure 4:
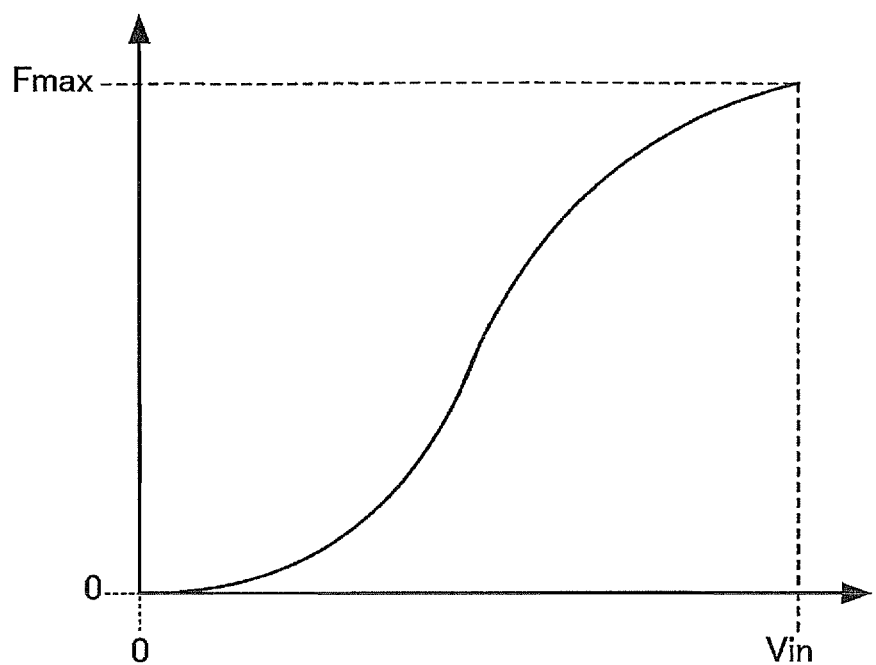
FIG. 4 shows characteristics of an output frequency F relative to an input voltage Vin of a conventional PLL circuit.
Figure 5:
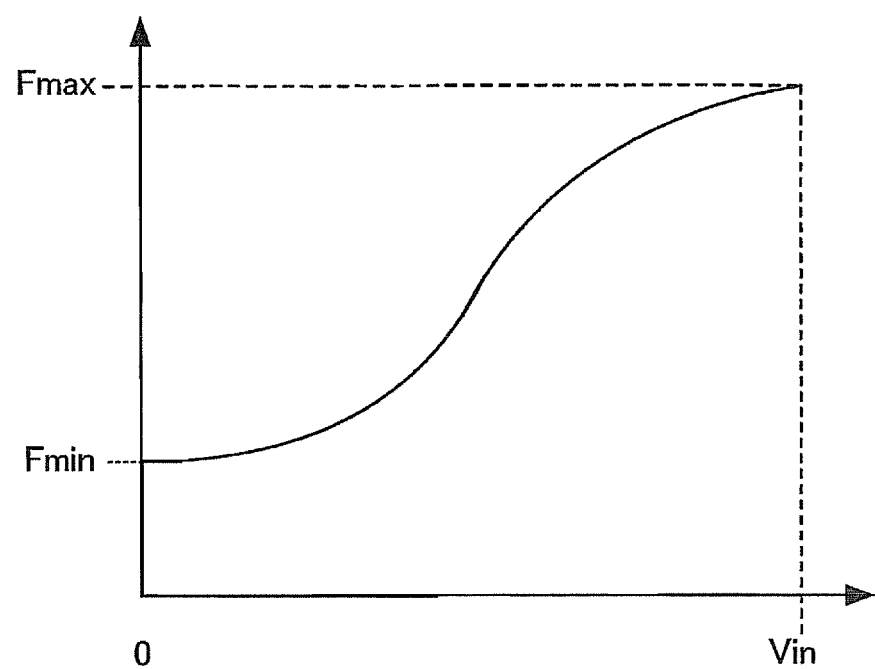
FIG. 5 shows characteristics of an output frequency F relative to an input voltage Vin of a PLL circuit in accordance with Embodiment Mode 1.

FIG. 5 shows the characteristics of the output frequency F relative to the input voltage Vin of a PLL circuit having the voltage-controlled oscillator 13 as shown in FIG. 3. FIG. 4 shows the characteristics of a conventional PLL circuit for comparison. In FIG. 5, it can be seen that the time required for obtaining a desired frequency can be shortened since the oscillation is performed with a frequency of Fmin even when the input voltage Vin is 0 V. That is, the lock time can be shortened. The oscillating frequency of Fmin at the time when the input voltage Vin is 0 V can be changed depending on the amount of current supplied to the current path 2.

Figure 6:
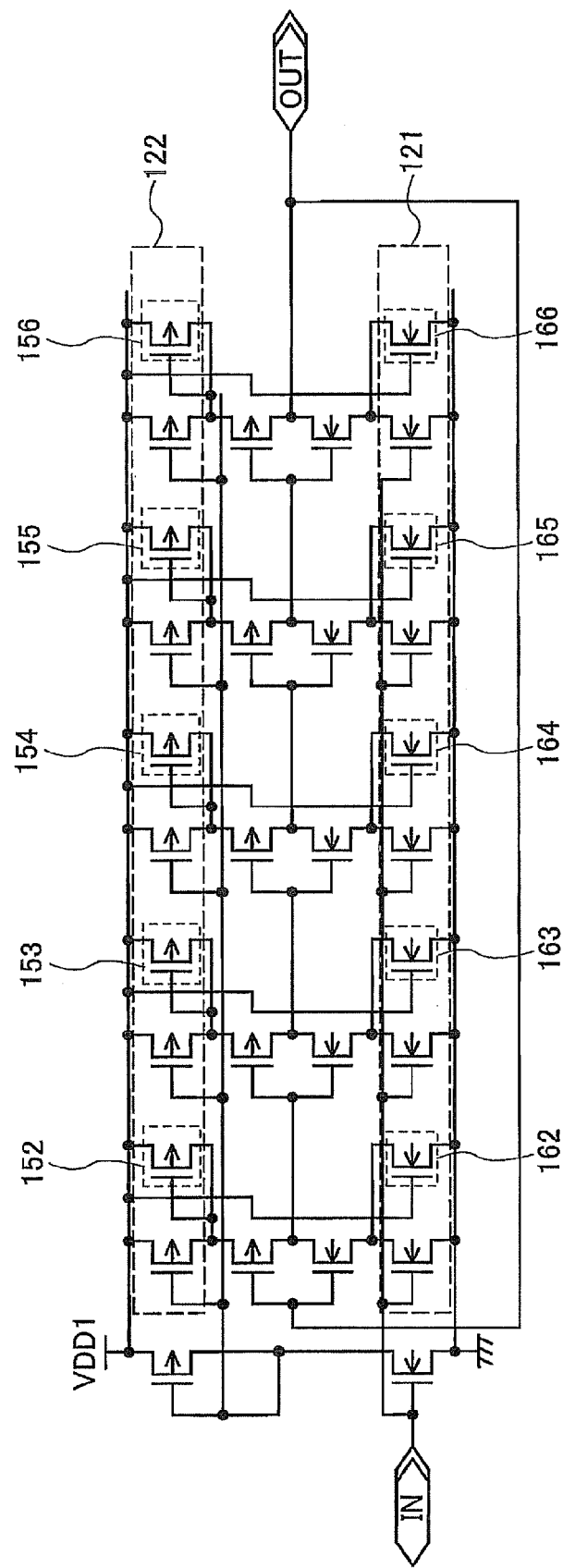
FIG. 6 shows a configuration of a phase detector in a PLL circuit in accordance with Embodiment Mode 2.

Description is made with reference to FIG. 6 of the voltage-controlled oscillator 13 having a different configuration from that in FIG. 3. Only parts which differ from those in FIG. 3 are described below. Each gate of the n-channel transistors 162 to 166 included in the current source unit 121 and the p-channel transistors 152 to 156 included in the current source unit 122 constantly receives a potential which turns on each transistor. That is, since the potential applied to the gate is independent of the Vin, a desired frequency can be obtained stably. Thus, the configuration of the n-channel transistors 162 to 166 and the p-channel transistors 152 to 156 is not limited to this. For example, each of the n-channel transistors 162 to 166 included in the current source unit 121 and the p-channel transistors 152 to 156 included in the current source unit 122 can be replaced by a resistor.

Moreover, the voltage-controlled oscillator 13 in FIG. 3 or FIG. 6 may have such a configuration that the p-channel transistors 102 to 106, and either the p-channel transistor 101 or the n-channel transistor 111 are omitted. In that case, the number of elements can be reduced. The reduction in the area occupied by elements will lead to downsizing and weight saving, while the reduction in the number of elements will lead to a higher yield.

According to this embodiment mode, a PLL circuit with short lock time can be realized by using a variable frequency oscillator (VCO). Furthermore, since a switch circuit which is usually required between the LF and the VCO can be omitted, noise interference on the input signal can be prevented.

Embodiment Mode 2

In this embodiment mode, a configuration of a unit circuit 21 (exclusive OR circuit) of the phase detector 11 is described with reference to FIG. 7. The unit circuit 21 includes a NOR circuit 221 and transistors 222 to 227. In addition, the unit circuit 21 has two input terminals (indicated by 1 and 2 in FIG. 7), and one output terminal (indicated by 3 in FIG. 7).

This unit circuit 21 operates in the following manner. Upon input of the same signals to the input terminal 1 and the input terminal 2, an H-level signal is output from the output terminal 3. Upon input of different signals to the input terminal 1 and the input terminal 2, an L-level signal is output from the output terminal 3. That is, the unit circuit 21 compares a phase of a signal input to the input terminal 1 with a phase of a signal input to the input terminal 2, and outputs a signal from the output terminal 3 based on the result of the comparison.

Figure 8:
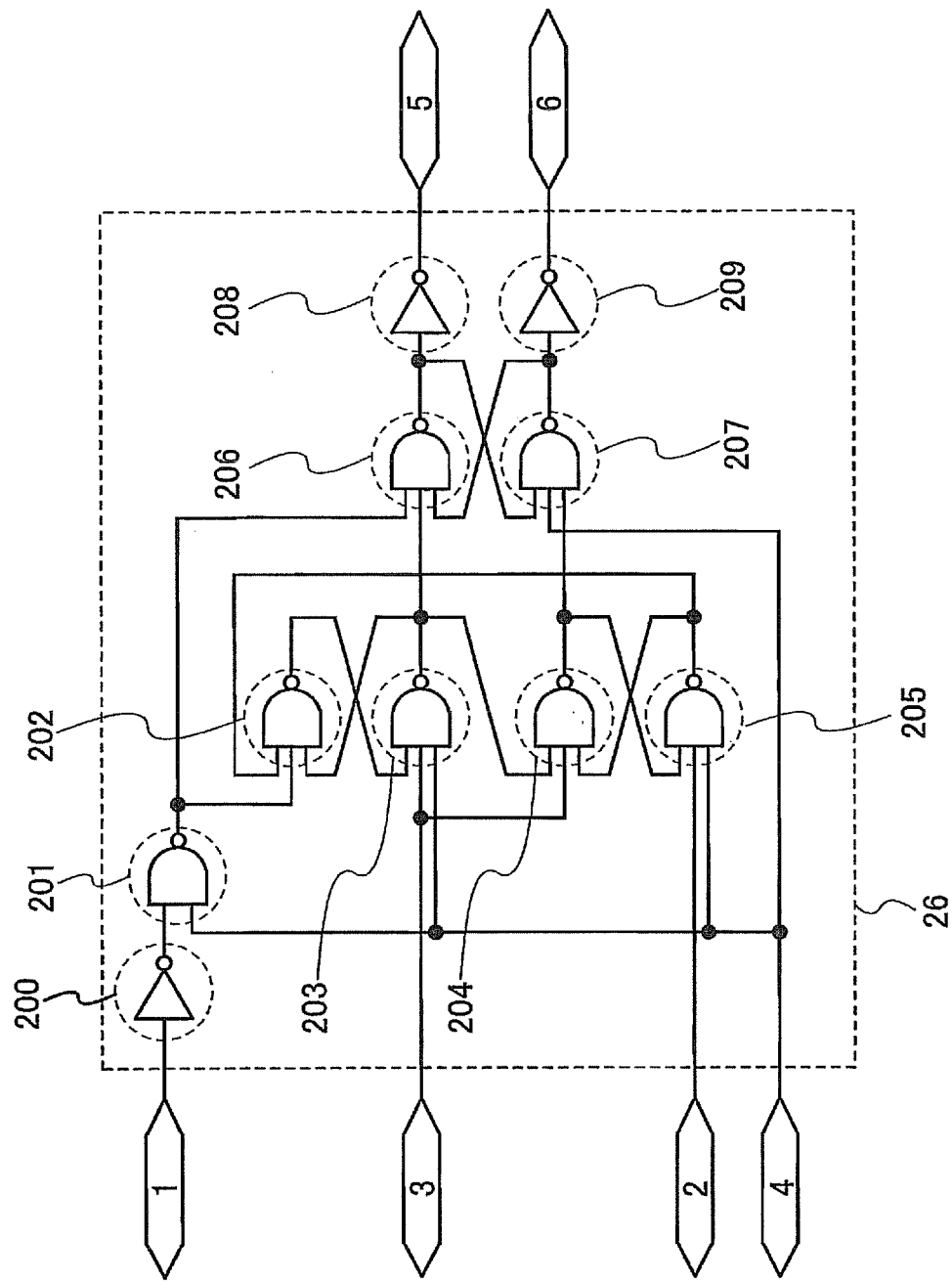
FIG. 8 shows a configuration of a unit circuit of a phase detector in a PLL circuit in accordance with Embodiment Mode 2.

Next, a configuration of a unit circuit 26 of the frequency divider 14 is described with reference to FIG. 8. The unit circuit 26 includes an inverter circuit 200, NAND circuits 201 to 207, and inverter circuits 208 and 209. This unit circuit 26 has four input terminals (indicated by 1, 2, 3, and 4 in FIG. 8) and two output terminals (indicated by 5 and 6 in FIG. 8). In addition, the unit circuit 26 includes three latches, formed respectively by the NAND circuits 202 and 203, the NAND circuits 204 and 205, and the NAND circuits 206 and 207.

This unit circuit 26 operates in the following manner. Upon input of a set signal to the input terminal 1, input of a data signal to the input terminal 2, input of a clock signal to the input terminal 3, and input of a reset signal to the input terminal 4, the output terminals 5 and 6 output data signals. Although the aforementioned configuration shows a set/reset D flip-flop circuit, the invention is not limited to this configuration. For example, a JK flip-flop circuit or a T flip-flop circuit may be employed.

Figure 7:
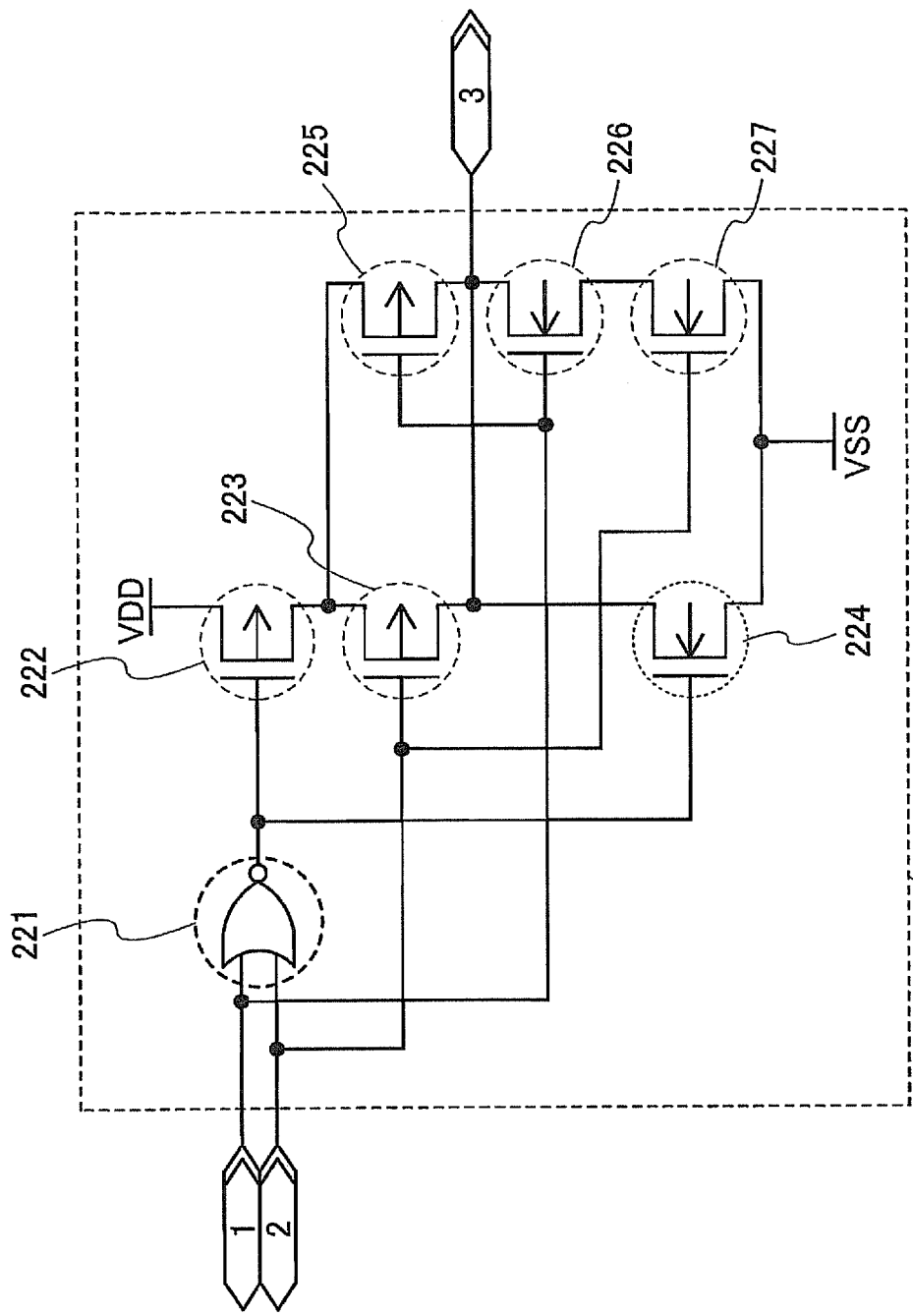
FIG. 7 shows a configuration of a unit circuit of a frequency divider in a PLL circuit in accordance with Embodiment Mode 2.

According to this embodiment mode, a PLL circuit with short lock time can be provided by using a variable frequency oscillator (VCO) in conjunction with the unit circuit 21 (exclusive OR circuit) shown in FIG. 7 which is used for the phase detector 11 of the PLL circuit in FIG. 1. Furthermore, since a switch circuit which is usually required between the LF and the VCO can be omitted, noise interference on the input signal can be prevented.

Embodiment Mode 3

Figure 9:
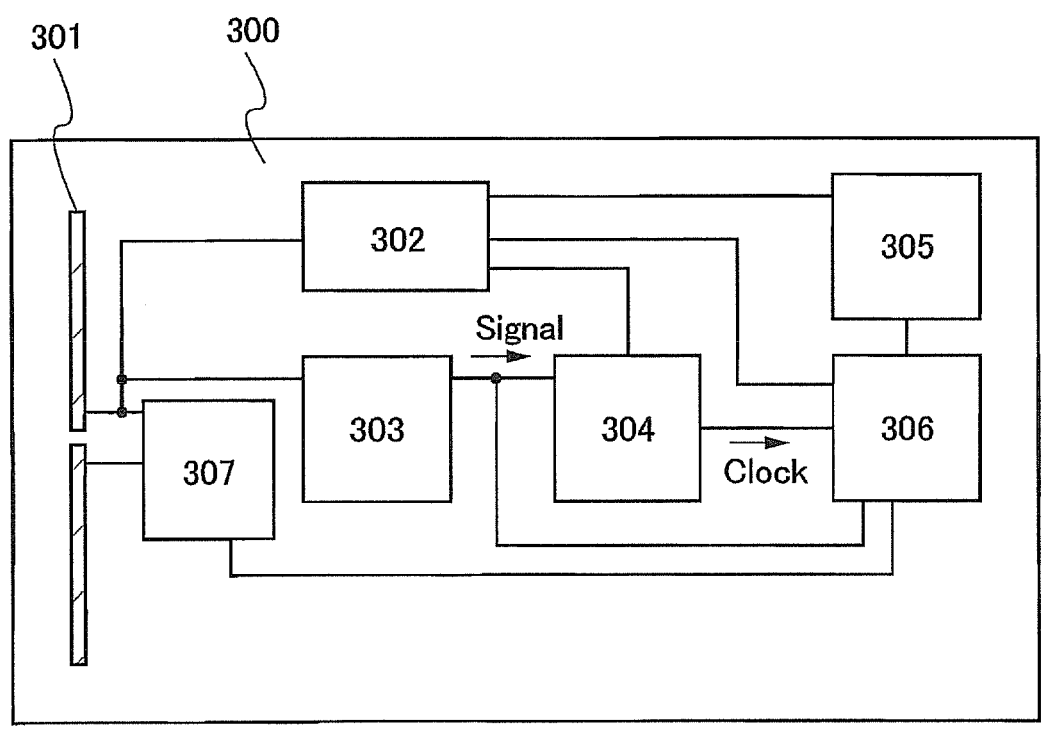
FIG. 9 shows a configuration of a semiconductor device in accordance with Embodiment Mode 3.

FIG. 9 shows a configuration of a semiconductor device in accordance with this embodiment mode. This semiconductor device 300 includes an antenna 301, a modulation circuit 307, a rectifier circuit 302, a demodulation circuit 303, a signal processing circuit 306, a memory 305, and a PLL circuit 304. The PLL circuit 304 has a similar configuration to Embodiment Mode 1. Signals which are transmitted from a reader device to this semiconductor device 300 are received at the antenna 301. One of the signals is used for generating power in the rectifier circuit 302. Modulated signals are demodulated in the demodulation circuit 303, and the demodulated signals are input into the PLL circuit 304. Then, the PLL circuit 304 generates clocks in synchronization with the demodulated signals. The signal processing circuit 306 processes the demodulated signals by using the clocks, and then sends the processed signals back to the modulation circuit 307.

The semiconductor device 300 in accordance with this embodiment mode can be constructed with thin film transistors. The modulation circuit 307, the rectifier circuit 302, the demodulation circuit 303, the signal processing circuit 306, the memory 305, and the PLL circuit 304 can be formed over the same substrate using thin film transistors.

At this time, a substrate over which the thin film transistors are formed may be formed of glass or plastic. In the case where a glass substrate is used, mass production is possible and manufacturing cost can be reduced as compared to the case of using a single crystalline silicon substrate. This is because a single crystalline silicon substrate has a diameter of 30 cm at the most, and compared to a glass substrate or the like, it is more expensive. In addition, in the case where a substrate is made of plastic, it is thin and lightweight, and what is more, it can be bent; therefore, it has high design flexibility and can be flexibly processed into various shapes. Furthermore, since it is shock-resistant and capable of being attached to or embedded into various objects easily, it can be applied to various uses. Note that plastic is a generic term for an organic high molecular compound, which includes phenol resin, melamine resin, polyethylene, polyvinyl chloride, polyether amide, polyethersulfone, acrylic, polyvinylidene chloride, and the like. Hereinafter, the manufacturing method of a thin film transistor is described with reference to drawings.

Figure 10A:
FIGS. 10A to 10C show a manufacturing process of a semiconductor device in accordance with Embodiment Mode 3.

Referring to FIG. 10A, an insulating layer 703 is formed as a base over a substrate 701. The insulating layer 703 is formed by depositing silicon oxide, silicon nitride and/or silicon oxynitride by sputtering or plasma CVD, in a single layer or in stacked layers. The base insulating layer can function as a blocking film to prevent intrusion of impurities from the substrate 701.

Figure 10B:
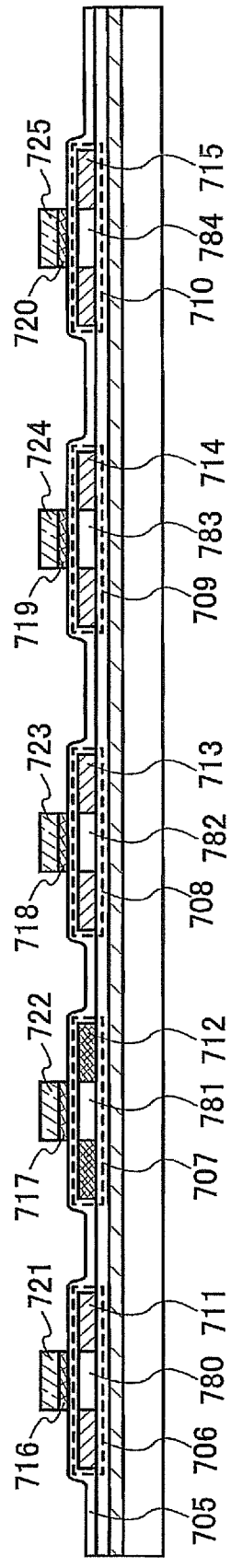

Next, an amorphous semiconductor layer 704 is formed over the insulating layer 703. The amorphous semiconductor layer 704 is formed by sputtering, LPCVD, plasma CVD, or the like. Subsequently, the amorphous semiconductor layer 704 is crystallized by laser annealing using a pulsed laser or a continuous wave laser. The pulsed laser may be an excimer laser which oscillates at 1 to 300 Hz, or a solid-state laser which oscillates at 1 to 10 MHz. Then, the crystalline semiconductor layer obtained is patterned into a desired shape so as to form crystalline semiconductor layers 706 to 710 as shown in FIG. 10B.

Next, a gate insulating layer 705 is formed covering the crystalline semiconductor layers 706 to 710. The gate insulating layer 705 is formed by depositing silicon oxide, silicon oxynitride, silicon nitride, or the like by plasma CVD or sputtering. In addition, before forming the gate insulating layer 705, high-density plasma treatment may be performed with microwave excitation at an electron temperature of about 1 to 3 eV. Plasma can be generated by using a plasma processing apparatus with microwave excitation with the use of a radial slot antenna. At this time, by setting the substrate temperature at 300 to 450° C. and processing the substrate in an oxidizing atmosphere (e.g., $O_2$, $N_2O$, or the like) or a nitriding atmosphere (e.g., $N_2$, $NH_3$, or the like), an excellent boundary can be formed between the substrate and the gate insulating layer deposited thereover. Alternatively, after depositing the gate insulating layer 705, similar plasma treatment may be performed. In this case, the gate insulating layer 705 can be densified. Such treatment will contribute to reducing the gate leakage current even when the gate insulating layer 705 is formed as thin as 100 nm or even thinner.

A first conductive layer and a second conductive layer are stacked over the gate insulating layer 705. The first conductive layer is formed to have a thickness of 20 to 100 nm by plasma CVD or sputtering. The second conductive layer is formed similarly, to have a thickness of 100 to 400 nm. The first conductive layer and the second conductive layer are formed of an element selected from among tantalum (Ta), tungsten (W), titanium (Ti), molybdenum (Mo), aluminum (Al), copper (Cu), chromium (Cr), or the like, or an alloy or compound material containing such elements as its main component. Alternatively, the first conductive layer and the second conductive layer are formed of a semiconductor material typified by polycrystalline silicon doped with impurity elements such as phosphorus. As an exemplary combination of the first conductive layer and the second conductive layer, the following combinations can be given: a layer made of tantalum nitride and a layer made of tungsten; a layer made of tungsten nitride and tungsten; a layer made of molybdenum nitride and molybdenum; and the like. Since tungsten and tantalum nitride have high heat resistance, thermal treatment can be performed for the purpose of thermal activation after forming the first conductive layer and the second conductive layer. In addition, when forming a three-layer structure instead of the two-layer structure, it is preferable to employ a stacked structure of a layer made of molybdenum, a layer made of aluminum, and a layer made of molybdenum. Then, etching is performed to form gate electrodes and gate lines, thereby forming conductive layers 716 to 725 functioning as gate electrodes.

Using the conductive layers 716 to 725 as masks, the crystalline semiconductor layers 706, 708 to 710 are doped with n-type impurity elements (typically, phosphorus (P) or arsenic (As)) by ion doling or ion implantation, thereby forming impurity regions 711, 713 to 715. This doping is a process for forming low concentration drain (LDD) regions in thin film transistors. In addition, the crystalline semiconductor layer 707 is doped with p-type impurity elements (typically, boron (B)) to form an impurity region 712.

Figure 10C:
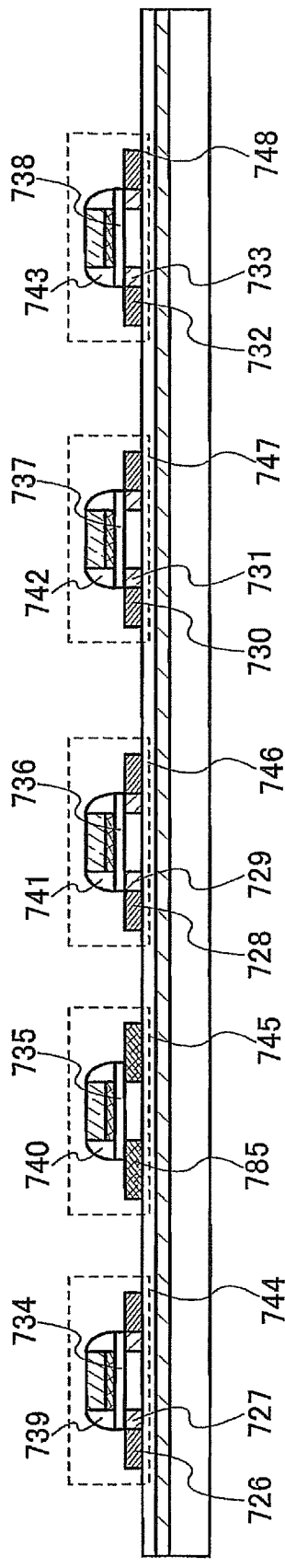

Then, an insulating layer is formed covering the gate insulating layer 705 and the conductive layers 716 to 725. The insulating layer is formed by depositing silicon oxide by plasma CVD. Then, sidewalls 739 to 743 are formed on opposite sides of the conductive layers 716 to 725 by anisotropic etching as shown in FIG. 10C. Although each width of the sidewalls 739 to 743 is determined by the channel length of the thin film transistors, it is preferably about 0.1 to 1 μm in thickness. By forming the sidewalls 739 to 743, gate insulating layers 734 to 738 are formed over the respective semiconductor layers.

Using these sidewalls 739 to 743 as masks, the crystalline semiconductor layers 706, 708 to 710 are doped with n-type impurity elements. This doping is a process for forming source and drain regions of the respective transistors. Accordingly, first impurity regions 727, 729, 731, and 733 for forming LDD regions, and second impurity regions 726, 728, 730, and 732 for forming sources or drains are determined. Through the aforementioned process, n-channel thin film transistors 744, 746 to 748 and a p-channel thin film transistor 745 are completed.

Figure 11A:
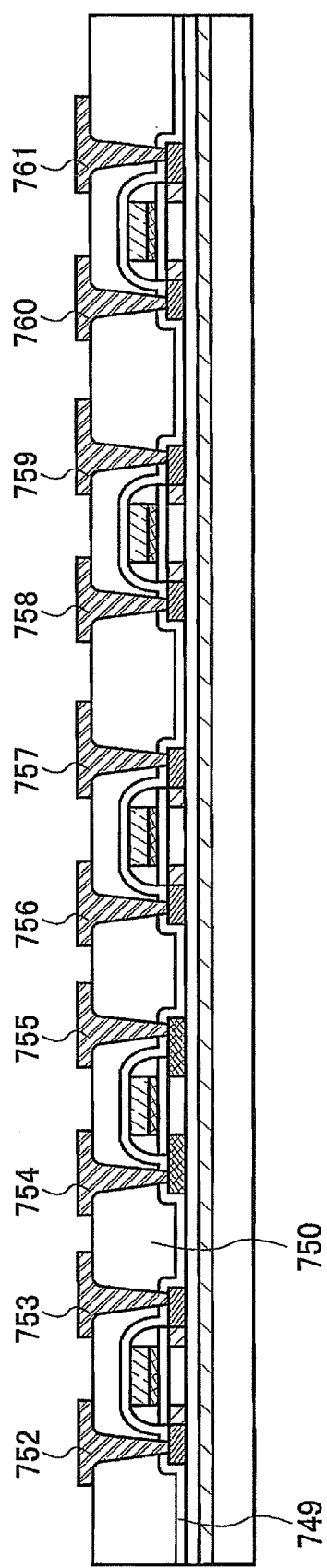
FIGS. 11A and 11B show a manufacturing process of a semiconductor device in accordance with Embodiment Mode 3.

As shown in FIG. 11A, an insulating layer 749 is formed covering the n-channel thin film transistors 744, 746 to 748 and the p-channel thin film transistor 745. This insulating layer 749 is formed of silicon nitride or silicon oxynitride. This insulating layer 749 has a function as a protective film. After depositing the insulating layer 749, it may be hydrogenated by performing high-density plasma treatment with microwave excitation by adding a hydrogen gas as described above. Alternatively, nitridation and hydrogenation may be performed to the insulating layer 749 by adding an ammonia gas. As a further alternative, oxynitridation and hydrogenation may be performed to the insulating layer 749 by adding an oxygen gas, an $N_2O$ gas, a hydrogen gas, and the like. By performing nitridation, oxidation, or oxynitridation with such a method, the surface of the insulating layer 749 can be densified. Accordingly, its function as a protective film can be reinforced. When the hydrogen which has been added into the insulating layer 749 made of silicon nitride is discharged thereafter by thermal treatment at 400 to 450° C., the semiconductor layers 706 to 710 can be hydrogenated.

Furthermore, an insulating layer 750 is deposited to form an interlayer insulating layer. This insulating layer 750 may be formed of silicon oxide, an organic material such as polyimide, polyamide, benzocyclobutene, acrylic, epoxy, or siloxane, or the like.

The insulating layers 749 and 750 are etched to form openings which expose the second impurity regions 726, 728, 730 and 732, and the impurity region 785. Subsequently, conductive layers 752 to 761 are formed to fill the openings in order to form a contact with the respective semiconductor layers. The conductive layers 752 to 761 are formed of a material selected from titanium (Ti), molybdenum (Mo), chromium (Cr), aluminum (Al), and an alloy containing aluminum as its main component, or a combination thereof. As the alloy containing aluminum as its main component, for example, there is an aluminum alloy containing 0.5 to 5% by weight of scandium, titanium, silicon, neodymium, or the like.

Figure 11B:
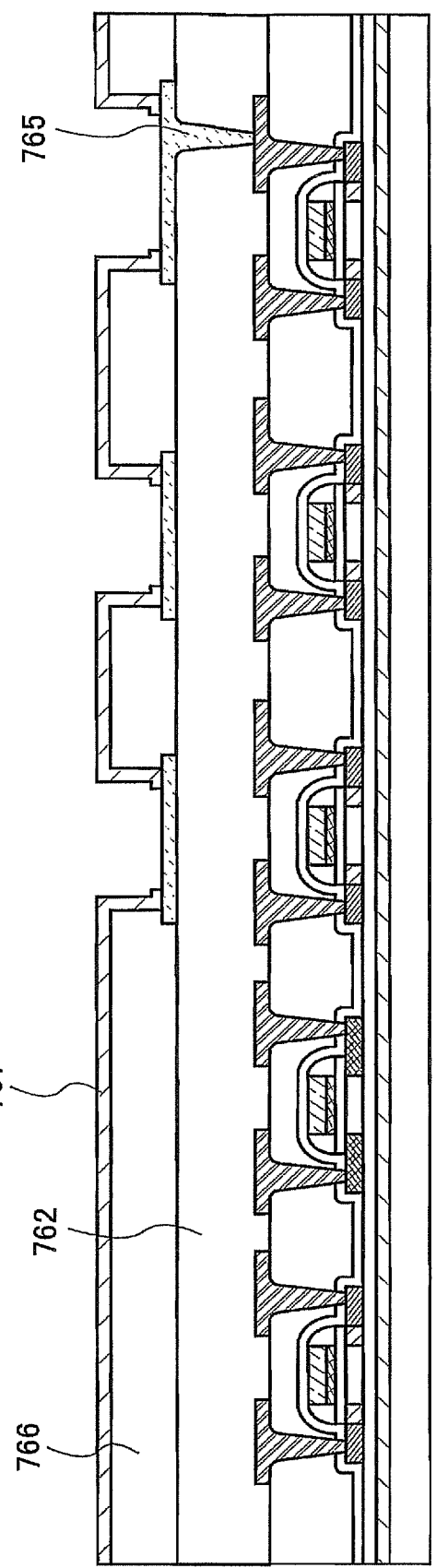

As shown in FIG. 11B, an insulating layer 762 is formed covering the conductive layers 752 to 761. The insulating layer 762 which is formed in a similar manner to the insulating layer 750 is preferably formed with a thickness of 0.75 to 3 μm. Furthermore, a silicon nitride layer to serve as a barrier layer against metals such as copper may be formed thereover.

The insulating layer 762 is etched by photolithography to form an opening. For example, an opening that exposes the conductive layer 761 is formed. Then, a conductive layer 765 is formed by depositing tantalum nitride or titanium nitride. Next, an insulating layer 766 is formed covering the conductive layer 765. The insulating layer 766 is formed using silicon oxide or the like. Furthermore, an insulating layer 767 formed of silicon nitride is preferably provided thereover.

Figure 12:
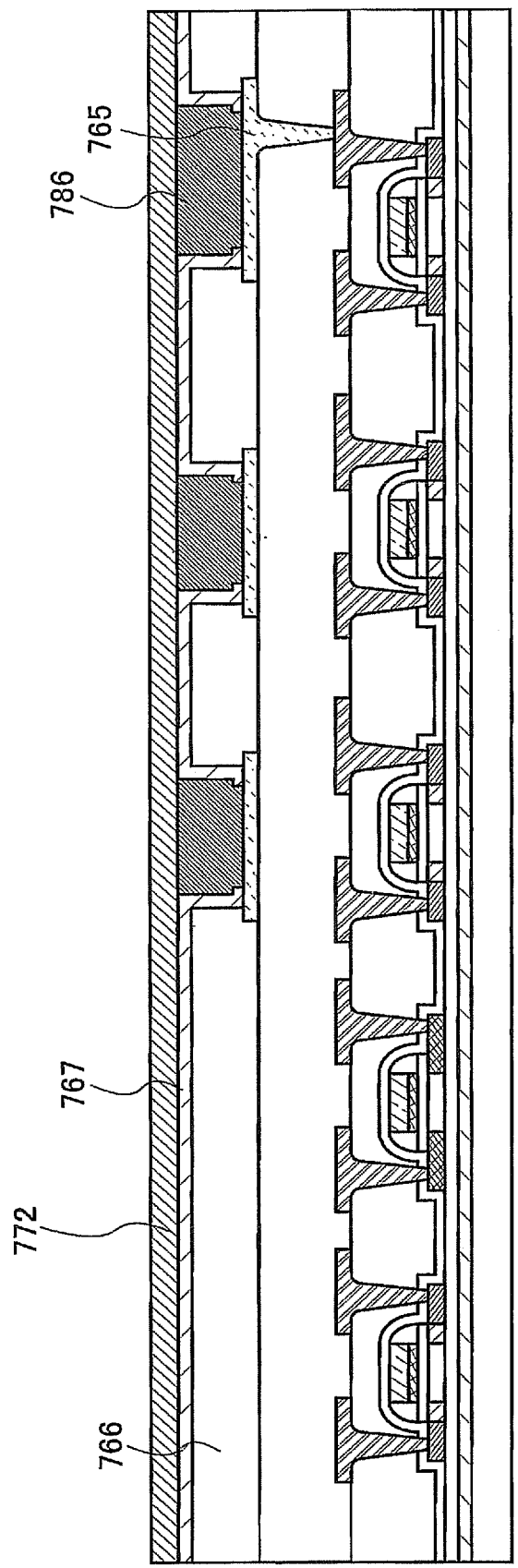
FIG. 12 shows a manufacturing process of a semiconductor device in accordance with Embodiment Mode 3.

As shown in FIG. 12A, a conductive layer 786 functioning as an antenna is formed in contact with the conductive layer 765. The conductive layer 786 is formed by depositing copper by plating. Alternatively, the conductive layer 786 may be formed by screen printing. The conductive layer 786 is formed with a thickness of 1 to 10 μm, or preferably 3 to 8 μm. By forming the conductive layer 786 with copper, the resistance of the antenna can be suppressed. Accordingly, the winding number of the antenna coil can be increased, which will increase the Q-value of the antenna. Over the conductive layer 786 for forming the antenna, an insulating layer 772 formed of silicon nitride or the like is preferably provided.

In this manner, the thin film transistors and the antenna can be formed over the same substrate. By forming various signal processing circuits and memory circuits with thin film transistors, the semiconductor device 300 as shown in FIG. 9 can be formed, which includes the modulation circuit 307, the rectifier circuit 302, the demodulation circuit 303, the signal processing circuit 306, the memory 305, the PLL circuit 304, and the antenna 301.

According to this embodiment mode, the semiconductor device as shown in FIG. 9 can be formed with thin film transistors. That is, the PLL circuits shown in Embodiment modes 1 and 2 can be formed with thin film transistors. Accordingly, a PLL circuit with short lock time can be realized. Furthermore, a semiconductor device including such a PLL circuit can be operated stably.

Embodiment Mode 4

Figure 13A:
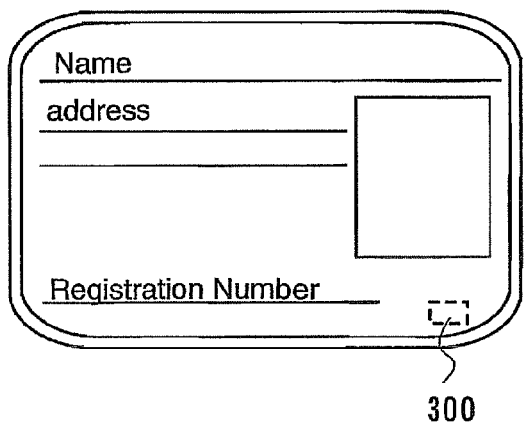
FIGS. 13A to 13E show exemplary applications in accordance with Embodiment Mode 4.
Figure 13B:
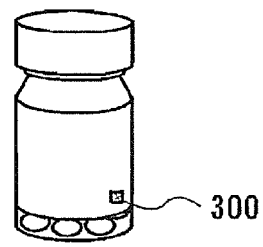
Figure 13C:
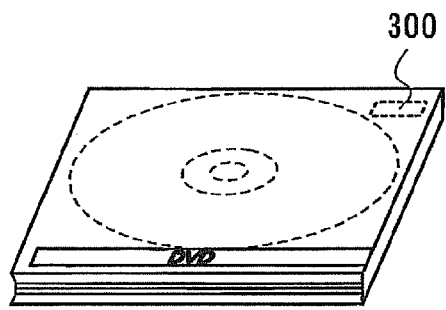
Figure 13D:
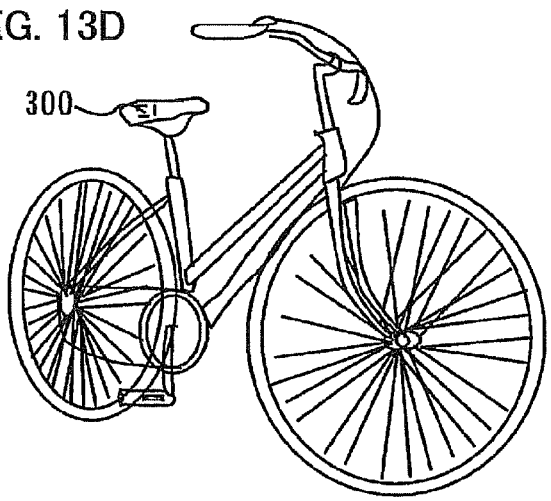
Figure 13E:
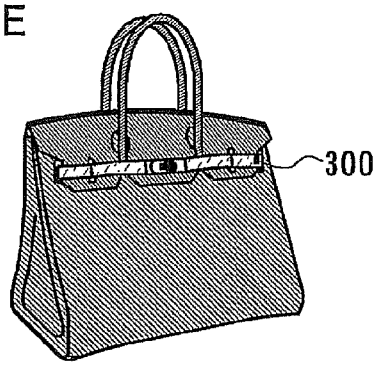

The semiconductor device 300 described in Embodiment Mode 3 can transmit and receive data wirelessly, and accordingly it can be applied to various uses. For example, the semiconductor device can be attached to or embedded in bills, coins, securities, bearer bonds, documents (e.g., driver's licenses, resident's cards, or the like, as shown in FIG. 13A), books, packaging containers (e.g., wrapping paper, bottles, or the like, as shown in FIG. 13B), recording media (e.g., DVD-R, video tapes, or the like, as shown in FIG. 13C), transportation devices (e.g., bicycles or the like, as shown in FIG. 13D), personal ornaments and accessories (shoes, glasses, or the like, as shown in FIG. 13E), groceries, clothing, everyday commodities, electronic apparatuses (e.g., liquid crystal display devices, EL display devices, television sets, portable terminals, or the like), or the like. For example, when applied to bills, coins, documents, or the like, the semiconductor device is attached to the surface thereof or embedded therein. When applied to a book, the semiconductor device is attached to the paper of the front cover or embedded therein. When applied to a packaging container, the semiconductor device is attached to the organic resin which forms the packaging container, or embedded therein. Moreover, if the semiconductor device is formed to have an identification function by giving an ID number in a memory circuit included in the semiconductor device, the applicable range of the semiconductor device can be further widened. For example, by applying the semiconductor device to a goods management system, an authentication system, a circulation system, or the like, high functionality, multifunctionality, and high added value of the system can be achieved.

The present application is based on Japanese Priority Application No. 2005-130491 filed on Apr. 27, 2005 with the Japanese Patent Office, the entire contents of which are hereby incorporated by reference.

EXPLANATION OF REFERENCE

11: phase detector, 12: loop filter, 13: voltage-controlled oscillator, 14: frequency divider, 21: unit circuit, 26: unit circuit, 101: p-channel transistor, 102: p-channel transistor, 103: p-channel transistor, 104: p-channel transistor, 105: p-channel transistor, 106: p-channel transistor, 111: n-channel transistor, 112: n-channel transistor, 113: n-channel transistor, 114: n-channel transistor, 115: n-channel transistor, 116: n-channel transistor, 120: oscillator circuit, 121: current source unit, 122: current source unit, 123: control unit 124: current source, 131: p-channel transistor, 132: p-channel transistor, 133: p-channel transistor, 134: p-channel transistor, 135: p-channel transistor, 141: n-channel transistor, 142: n-channel transistor, 143: n-channel transistor, 144: n-channel transistor, 145: n-channel transistor, 152: p-channel transistor, 153: p-channel transistor, 154: p-channel transistor, 155: p-channel transistor, 156: p-channel transistor, 162: n-channel transistor, 163: n-channel transistor, 164: n-channel transistor, 165: n-channel transistor, 166: n-channel transistor, 200: inverter circuit, 201: NAND circuit, 202: NAND circuit, 203: NAND circuit, 204: NAND circuit, 205: NAND circuit, 206: NAND circuit, 207: NAND circuit, 208: inverter circuit, 209: inverter circuit, 221: NOR circuit, 222: transistor, 223: transistor, 224: transistor, 225: transistor, 226: transistor, 227: transistor, 300: semiconductor device, 301: antenna, 302: rectifier circuit, 303: demodulation circuit, 304: PLL circuit, 305: memory, 306: signal processing circuit, 307: modulation circuit, 701: substrate, 703: insulating layer, 704: amorphous semiconductor layer, 705: gate insulating layer, 706: crystalline semiconductor layer, 707: crystalline semiconductor layer, 708: crystalline semiconductor layer, 709: crystalline semiconductor layer, 710: crystalline semiconductor layer, 711: impurity region, 712: impurity region, 713: impurity region, 714: impurity region, 715: impurity region, 716: conductive layer, 717: conductive layer, 718: conductive layer, 719: conductive layer, 720: conductive layer, 721: conductive layer, 722: conductive layer, 723: conductive layer, 724: conductive layer, 725: conductive layer, 726: second impurity region, 727: first impurity region, 728: second impurity region, 729: first impurity region, 730: second impurity region, 731: first impurity region, 732: second impurity region, 733: first impurity region, 734: gate insulating layer, 735: gate insulating layer, 736: gate insulating layer, 737: gate insulating layer, 738: gate insulating layer, 739: sidewall, 740: sidewall, 741: sidewall, 742: sidewall, 743: sidewall, 744: n-channel thin film transistor, 745: p-channel thin film transistor, 746: n-channel thin film transistor, 747: n-channel thin film transistor, 748: n-channel thin film transistor, 749: insulating layer, 750: insulating layer, 752: conductive layer, 753: conductive layer, 754: conductive layer, 755: conductive layer, 756: conductive layer, 757: conductive layer, 758: conductive layer, 759: conductive layer, 760: conductive layer, 761: conductive layer, 762: insulating layer, 765: conductive layer, 766: insulating layer, 767: insulating layer, 772: insulating layer, 785: impurity region, and 786: conductive layer

What is claimed is:

1. A semiconductor device comprising:
a first transistor;
a second transistor;
a third transistor;
a fourth transistor;
a fifth transistor;
a first power supply line; and
a second power supply line,
wherein a first terminal of the first transistor is electrically connected to the first power supply line,
wherein a second terminal of the first transistor is electrically connected to a first terminal of the second transistor, wherein a second terminal of the second transistor is electrically connected to a first terminal of the third transistor, wherein a second terminal of the third transistor is electrically connected to a first terminal of the fourth transistor, wherein a second terminal of the fourth transistor is electrically connected to the second power supply line, wherein a first terminal of the fifth transistor is electrically connected to the first power supply line, wherein a second terminal of the fifth transistor is electrically connected to the first terminal of the second transistor, and wherein a gate of the fifth transistor is electrically connected to the first terminal of the fourth transistor.

2. The semiconductor device according to claim 1, further comprising a sixth transistor, wherein a first terminal of the sixth transistor is electrically connected to the first terminal of the fourth transistor, wherein a second terminal of the sixth transistor is electrically connected to the second power supply line, and wherein a gate of the sixth transistor is electrically connected to a gate of the first transistor.

3. The semiconductor device according to claim 2, wherein a gate of the second transistor is electrically connected to a gate of the third transistor.

4. The semiconductor device according to claim 1, further comprising a seventh transistor and an eighth transistor, wherein a first terminal of the seventh transistor is electrically connected to the first power supply line, wherein a second terminal of the seventh transistor is electrically connected to a first terminal of the eighth transistor, wherein a second terminal of the eighth transistor is electrically connected to the second power supply line, wherein a gate of the seventh transistor is electrically connected to a gate of the first transistor, wherein a gate of the eighth transistor is electrically connected to the first terminal of the eighth transistor, and wherein the gate of the eighth transistor is electrically connected to a gate of the fourth transistor.

5. The semiconductor device according to claim 4, further comprising a sixth transistor, wherein a first terminal of the sixth transistor is electrically connected to the first terminal of the fourth transistor, wherein a second terminal of the sixth transistor is electrically connected to the second power supply line, wherein a gate of the sixth transistor is electrically connected to the gate of the first transistor.

6. The semiconductor device according to claim 5, wherein a gate of the second transistor is electrically connected to a gate of the third transistor.

7. The semiconductor device according to claim 1, wherein at least one of the first transistor, the second transistor, the third transistor, the fourth transistor, and the fifth transistor is a thin film transistor.

8. A semiconductor device comprising:
a first transistor;
a second transistor;
a third transistor;
a fourth transistor;
a fifth transistor;
a sixth transistor;
a first power supply line; and
a second power supply line,
wherein a first terminal of the first transistor is electrically connected to the first power supply line, wherein a second terminal of the first transistor is electrically connected to a first terminal of the second transistor, wherein a second terminal of the second transistor is electrically connected to a first terminal of the third transistor, wherein a second terminal of the third transistor is electrically connected to a first terminal of the fourth transistor, wherein a second terminal of the fourth transistor is electrically connected to the second power supply line, wherein a first terminal of the fifth transistor is electrically connected to the first power supply line, wherein a second terminal of the fifth transistor is electrically connected to the first terminal of the second transistor, wherein a gate of the fifth transistor is electrically connected to the second power supply line, wherein a first terminal of the sixth transistor is electrically connected to the first terminal of the fourth transistor, wherein a second terminal of the sixth transistor is electrically connected to the second power supply line, and wherein a gate of the sixth transistor is electrically connected to the first terminal of the fourth transistor.

9. A semiconductor device according to claim 8, wherein a gate of the second transistor is electrically connected to a gate of the third transistor.

10. A semiconductor device according to claim 8, further comprising a seventh transistor and an eighth transistor, wherein a first terminal of the seventh transistor is electrically connected to the first power supply line, wherein a second terminal of the seventh transistor is electrically connected to a first terminal of the eighth transistor, wherein a second terminal of the eighth transistor is electrically connected to the second power supply line, wherein a gate of the seventh transistor is electrically connected to a gate of the first transistor, wherein a gate of the eighth transistor is electrically connected to the first terminal of the eighth transistor, and wherein the gate of the eighth transistor is electrically connected to a gate of the fourth transistor.

11. A semiconductor device according to claim 10, wherein a gate of the second transistor is electrically connected to a gate of the third transistor.

12. The semiconductor device according to claim 8, wherein at least one of the first transistor, the second transistor, the third transistor, the fourth transistor, and the fifth transistor is a thin film transistor.

13. A semiconductor device comprising:
a first transistor;
a second transistor;
a third transistor;
a fourth transistor;
a fifth transistor;
a first power supply line; and
a second power supply line,
wherein a first terminal of the first transistor is electrically connected to the first power supply line, wherein a second terminal of the first transistor is electrically connected to a first terminal of the second transistor, wherein a second terminal of the second transistor is electrically connected to a first terminal of the third transistor, wherein a second terminal of the third transistor is electrically connected to a first terminal of the fourth transistor, wherein a second terminal of the fourth transistor is electrically connected to the second power supply line, wherein a first terminal of the fifth transistor is electrically connected to the first terminal of the fourth transistor, wherein a second terminal of the fifth transistor is electrically connected to the second power supply line, and wherein a gate of the fifth transistor is electrically connected to the first terminal of the fourth transistor.

14. A semiconductor device according to claim 13, wherein a gate of the second transistor is electrically connected to a gate of the third transistor.

15. A semiconductor device according to claim 13, further comprising a sixth transistor and a seventh transistor, wherein a first terminal of the sixth transistor is electrically connected to the first power supply line, wherein a second terminal of the sixth transistor is electrically connected to a first terminal of the seventh transistor, wherein a second terminal of the seventh transistor is electrically connected to the second power supply line, wherein a gate of the sixth transistor is electrically connected to a gate of the first transistor, wherein a gate of the seventh transistor is electrically connected to the first terminal of the seventh transistor, and wherein the gate of the seventh transistor is electrically connected to a gate of the fourth transistor.

16. A semiconductor device according to claim 15, wherein a gate of the second transistor is electrically connected to a gate of the third transistor.

17. The semiconductor device according to claim 13, wherein at least one of the first transistor, the second transistor, the third transistor, the fourth transistor, and the fifth transistor is a thin film transistor.

* * * * *